United States Patent [19]

Yaeda

[11] Patent Number: 4,657,406
[45] Date of Patent: Apr. 14, 1987

[54] TIMING GENERATING DEVICE
[75] Inventor: Shigeru Yaeda, Gyoda, Japan
[73] Assignee: Advantest Corporation, Tokyo, Japan
[21] Appl. No.: 828,971
[22] Filed: Feb. 13, 1986
[30] Foreign Application Priority Data
  Jul. 10, 1985 [JP] Japan .................. 60-151797
[51] Int. Cl.[4] .................. G04F 8/00
[52] U.S. Cl. .................. 368/120
[58] Field of Search .................. 368/120, 118, 119
[56] References Cited
  U.S. PATENT DOCUMENTS
  4,165,490 8/1979 Howe, Jr. et al. .................. 328/60
  4,516,861 5/1985 Frew et al. .................. 368/120
  FOREIGN PATENT DOCUMENTS
  2987 8/1979 Japan .................. 368/120

Primary Examiner—Bernard Roskoski
Attorney, Agent, or Firm—Staas & Halsey

[57] ABSTRACT

A timing generating device, in which a period generator generates pulses the average period of which is equal to a preset period, at intervals of an integral of a reference clock period T, and provides fractional period data which indicates the phase difference between the above pulses and pulse of the preset period for each of them. From a coarse delay circuit is yielded a pulse delayed behind the former pulse according to coarse delay data in a preset delay amount which indicates a value greater than the reference clock period T. Fractional delay data in the preset delay amount which indicates a value smaller than the reference clock period, and the fractional period data are added together. By the added output the delayed pulses from the coarse delay circuit is delayed in a fine delay section by a value corresponding to the added value, producing a timing pulse.

20 Claims, 16 Drawing Figures

TIMING GENERATING DEVICE

BACKGROUND OF THE INVENTION

The present invention relates to a timing generating device which is employed, for example, in IC test equipment, for generating timing signals of various preset periods and phases.

This kind of timing generating device heretofore employed has such an arrangement as shown in FIG. 1. Based on period data set in a period generating section 11 a period generator 12 yields pulses $A_1$ of a period m (where m is a variable positive integer) times the period T of a reference clock (CK in FIG. 2) which is applied to a terminal 13 and pulses $A_2$ of a period p (where p is a positive integer smaller than the abovesaid m) times the period T. In FIG. 2 the period mT of the pulses $A_1$ assumes 8T and 9T alternately and the period pT of the pulses $A_2$ is 2T within each sequence. The average period of the pulses $A_1$ is equal to a set period. The period generator 12 further creates fractional period data RD indicative of a delay time shorter than the period T in accordance with low order data of a weight less than the period T in the abovementioned preset period data and the state of generation of the pulses $A_1$. The fractional period data RD represents the phase difference between the pulses of the preset period and the pulses $A_1$ upon each occurrence of them.

The pulses $A_1$ and $A_2$ and the fractional period data RD are introduced into a fine delay circuit 14, wherein some of the pulses $A_1$ and $A_2$ are delayed for a period of time shorter than the period T in accordance with the fractional period data RD and from which they are output as pulses $B_1$ and $B_2$, respectively. In the example depicted in FIG. 2 the pulses $A_1$ are alternately delayed by T/2 and all the pulses $A_2$ which occur between the pulse $A_1$ to be delayed and the immediately following pulse $A_1$ are also delayed by T/2. The period of the pulses $B_1$ becomes the preset period, i.e. 8.5 T in this example.

The pulses $B_1$ and $B_2$ are provided to a coarse delay circuit 16 of a delay generating section 15. The coarse delay circuit 16 is supplied with high order delay data CDH contained in delay data CD set in a delay setting means 17. The coarse delay circuit 16 delays the pulses $B_1$ in units of the period of the pulses $B_2$ in accordance with the data CDH, yielding pulses E. FIG. 2 shows the case where the pulses E are each delayed by 4T. The pulses E are applied to a fine delay circuit 18, wherein they are delayed corresponding to low order delay data CDL contained in the delay data CD set in the delay setting means 17, producing pulses F, that is, timing pulses.

Conventionally, the period generator 12 has such an arrangement as depicted in FIG. 3. A period (m+k)T (where m is a positive integer and $0 \leq k < 1$) to be generated is set in a period setting means 21, from which corresponding period data is provided. Let the number of bits weighted more heavily than a unit period T in the period data and the number of bits weighted less heavily than the unit period T be represented by $n_1$ and $n_2$, respectively. In FIG. 3 the bit numbers are $n_1 = 5$ and $n_2 = 2$ and weights of the respective bits are represented by multiples of T. In this example data indicating a value obtained by subtracting T from the period (m+k)T to be generated is provided from the period setting means 21. In the example depicted in FIG. 2 the period (m+k)T to be generated is 8.5 T and period data 0011110 is output correspondingly, as shown in FIG. 3.

A set-reset flip-flop 22 for starting-state setting use and an $n_2$-bit D flip-flop 23 for accumulation use are pre-reset by an initialization signal INIT from a terminal 24. As depicted in FIG. 4, upon application of a start signal START to a terminal 25, the flip-flop 22 is set to make its Q output G1 high-level, enabling gates 26 and 27. The start signal START is applied as well to an OR gate 28, the output $S_6$ of which is provided to a gate 29 to enable it. The reference clock pulses CK from a clock generator 10 are applied via the terminal 13 to the gate 29, from which one of the reference clock pulses is output as the pulse $A_1$. Further, the output $S_6$ of the OR gate 28 is provided to a load terminal LO of an $n_1$-bit down counter 31. The counter 31 is a clock-synchronous-type counter, in which data of the high order $n_1$ bits in the output of the period setting means 21, that is, data corresponding to mT, are preset by the negative-going edge of the reference clock CK when the signal $S_6$ is being applied. That is, the counter 31 is initialized and its count value $D_1$ is set to 7 in this example, as depicted in FIG. 4. Thereafter the counter 31 is decremented by the negative-going edge of each reference clock pulse CK.

The output $S_6$ of the OR gate 28 is applied as well to a differentiation circuit 32, the output $S_7$ of which is provided to a counter 33, clearing its count value $D_4$ to zero. The counter 33 is to make the period of the pulses $A_2$ p times longer than the period T. In this example p=2 and upon each counting of two reference clock pulses CK by the counter 33, an inverter 34 yields a signal $S_8$ of a duration equal to the period T. The signal $S_8$ is fed to the gate 27, from which is obtained, as the pulse $A_2$, output of coincidence between the signals $G_1$ and $S_8$ and the reference clock pulse CK.

Data corresponding to the low order $n_2$ bits or kT contained in the set period data output from the period setting means 21 is provided to an $n_2$-bit adder 35, wherein it is added to the output of the $n_2$-bit flip-flop 23, and the added output is supplied to data terminals $D_0$ and $D_1$ of the flip-flop 23. In this example $n_2=2$, so the adder 35 is a 2-bit adder. A carry output $C_1$ of the adder 35 is applied to a gate 36 after being inverted and to a gate 37 without being inverted. In the initial state the flip-flop 23 is reset and its output is "0", so that the carry output $C_1$ is "0" and the gate 36 remains enabled. A high order bit output $d_2$ in the 2-bit output of the adder 35 is high-level since in this example two low order bits of the set period data are "1" and "0", respectively. The output of the adder 35 is applied to the flip-flop 23 upon the fall of the output $S_5$ from the gate 26 and the output of the flip-flop 23 is provided as the fractional period data RD of the period generator 12. The flip-flop 23 and the adder 35 constitute an accumulator 20.

When the down counter 31 has counted the reference clock pulses CK by the number corresponding to the number m which is set to 7 in this example, that is, when the count value $D_1$ of the counter 31 is decremented to zero, a zero detector 38 yields an output $S_1$, which is applied to the gate 36, the output $S_2$ of which is provided via an OR gate 39 to the gate 26, the output $S_5$ of which is fed to the OR gate 28. In consequence, the gate 29 produces, as the pulse $A_1$, one reference clock pulse CK 8T apart from the pulse $A_1$ which occurred at the start of operation. Moreover, the output generation from the OR gate 28 induces an output from the differentiation circuit 32, by which the counter 33 is cleared and the high order $n_1$ bits of the set period data are preset in the down counter 31. By the negative-going edge of the output $S_5$ of the gate 26 the output of the adder 35 is input into the flip-flop 23, the outputs $d_3$ and $d_4$ of which go to "1" and "0", respectively. The high order bit output $d_3$ goes high, so that the output bits of the adder 35 both go to "0s", its carry output $C_1$ becomes high-level and its output $d_2$ low-level.

In this state similar operations are performed. When the down counter 31 is decremented to zero next, the output $S_1$ of the detector 38 is fed to the gate 37, the output $S_3$ of which is placed by the next reference clock pulse CK into a D flip-flop 41, the outputs $S_4$ of which is, in turn, applied to the gate 26. Consequently, the pulse $A_1$ is provided from the gate 29 as in the above, but this pulse $A_1$ is 9T apart from the preceding pulse $A_1$. Furthermore, the output $S_5$ of the gate 26 is applied to the flip-flop 23 to make its output $d_3$ low-level, with the result that the output $d_2$ of the adder 35 goes high, thus returning the period generator 12 to the initial state. Therefore, the same operations as described above are repeated. Namely, the period of the pulses $A_1$ becomes 8T and 9T alternately, the period of the pulses $A_2$ becomes 2T and the fractional period data RD assumes $d_3=0$, $d_4=0$ (0T) and $d_3=1$, $d_4=0$ (0.5T) for the periods of 8T and 9T, respectively. In other words, data corresponding to kT in the output data of the period setting means 21 is accumulated in an accumulation circuit 20 upon each occurrence of the pulse $A_1$, and the bits $d_3$ and $d_4$ in the accumulated output, except the carry bit, are provided as the fractional period data RD. Moreover, the output of the detector 38 is switched by the gates 36 and 37 to the OR gate 39 or the flip-flop 41 acting as a delay, from which it is applied to the gate 26 without being delayed or after being delayed by T.

The fine delay circuit 14 in FIG. 1 has an arrangement such, for instance, as depicted in FIG. 5. The pulses $A_1$ and $A_2$ from the period generator 12 are respectively delayed by delay circuits 42 and 43 and supplied as pulses $A_1'$ and $A_2'$ to gates 44, 45 and 46, 47, respectively, as shown in FIG. 6. The delay circuits 42 and 43 have the same delay time. This delay is effected so that the fractional period data RD is changed prior to the occurrence of the pulse $A_1'$, that is, the pulse $A_1$ is delayed to assure that the added output of the adder 35 has been settled in the flip-flop 23 and its new output has been established at the occurrence of the pulse $A_1'$. While the period of the pulses $A_1$ is 8T, the fractional period data RD is $d_3=0$ and by the bit $d_3$ the gates 44 and 46 are enabled and the gates 45 and 47 disabled. The outputs of the gates 44 and 46 are supplied via OR gates 48 and 49 to gates 51, 52 and 53, 54, respectively, and the outputs of the gates 51 and 53 are provided to OR gates 55 and 56, respectively. In the above example the data $d_4$ is always "0" and by this bit $d_4$ the gates 51 and 53 are always enabled and the gates 52 and 54 disabled. Accordingly, while $d_3=0$, the pulses $A_1'$ and $A_2'$ are respectively output as pulses $B_1$ and $B_2$ via the gates 44, 48, 51, 55 and 46, 49, 53, 56. While the period of the pulses $A_1$ is 9T, since $d_3=1$ and $d_4=0$, the gates 44 and 46 are closed and the gates 45 and 47 open. The pulses $A_1'$ and $A_2'$ are supplied via the gates 45 and 47 to T/2-delay elements 57 and 58, wherein they are delayed by T/2, and the delayed outputs are provided as the pulses $B_1$ and $B_2$ via the gates 48, 51, 55 and via the gates 49, 53 and 56. The occurrence of pulse $B_1$ produced at this time is 8.5T after the preceding pulse $B_1$ having passed through the gates 44, 48, 51 and 55. The next pulse $A_1'$ passes through the gate 44. Thereafter the same operation repeats itself, making the period of the pulses $B_1$ 8.5T. Incidentally, the outputs of the gates 52 and 54 are provided to the OR gates 55 and 56 via T/4 delay circuits 61 and 62.

FIG. 7 illustrates an example of the coarse delay circuit 16 used in FIG. 1. A clock-synchronous-type counter 63 is cleared by the pulses $B_1$ and the pulses $B_2$ are delayed by a delay circuit 64 and are counted, as pulses $B_2'$, by the counter 63, as shown in FIG. 8. That is, the counter 63 starts to count the pulses $B_2'$ after being cleared. The high order data CDH of the data indicating the set delay time, which is available from the delay setting means 17, is composed of four bits $b_1$, $b_2$, $b_3$ and $b_4$ representing delay time 16T, 8T, 4T and 2T, respectively, and since only the bit $b_3$ is "1" and the other bits are "0s", the set delay time is 4T. The high order data CDH and the count value $D_5$ of the counter 63 are compared by a coincidence detector 65. As depicted in FIG. 8, when the count value $D_5$ has reached 2, the coincidence detector 65 yields an output $S_9$, by which a gate 66 is enabled, and the pulse $B_2'$ occurring in this while is output as the delayed pulse E.

The fine delay circuit 18 in FIG. 1 has an arrangement such, for example, as shown in FIG. 9. Fractional delay data CDL which is represented by low order bits in the delay data corresponding to the delay time set in the delay setting means 17 is composed of three bits $b_5$, $b_6$ and $b_7$, representing delay time T, T/2 and T/4, respectively, by which pairs of gates 67 and 68, 71 and 72, 73 and 74 are each controlled to be enabled and disabled. The delayed pulse E is applied to the gates 67 and 68. The outputs of the gates 67, 71 and 73 are provided to OR gates 75, 76 and 77, whereas the outputs of the gates 68, 72 and 74 are fed via T, T/2 and T/4 delay elements 78, 79 and 81 to the OR gates 75, 76 and 77. The output of the OR gate 75 is applied to the gates 71 and 72 and the output of the OR gate 76 to the gates 73 and 74. In the case where the fractional delay data CDL is a T/2 delay, the bits $b_5$, $b_6$ and $b_7$ are a "0", a "1" and a "0", respectively, and the gates 67, 72 and 73 are enabled and the gates 68, 71 and 74 disabled. The pulse E passes through the gates 67, 75 and 72, a T/2 delay element 79 and the gates 76, 73 and 77 and is output as the pulse F delayed by 0.5T, as shown in FIG. 8. In FIG. 8 broken-lined ones of the pulses E and F indicate the positions of pulses which occur when the set delay time is zero.

As described above, according to the prior art timing generating device, the operation starts with the creation of the pulse $B_1$ of a period set in the period generating section 11 and then the pulse $B_1$ is delayed by a value set in the delay generating section 15. To perform this, the period generating section 11 employs the fine delay circuit 14 and the delay generating section 15 also uses the fine delay circuit 18. In order to produce timing pulses of various periods and phases in small units, that is, to enhance resolution, it is necessary to increase the number of delay switching stages in each of the fine delay circuits 14 and 18 and to use delay elements of small delay amounts. Since the unit of delay by the coarse delay circuit 16 is an integral multiple of the reference clock period T, i.e. 2T in the above example, the number of delay switching stages in the fine delay circuit 18 is greater than in the fine delay circuit 14. For instance, a frequency as high as 250 or 500 MHz has come into use as the reference clock in IC test equipment. In such a case, an extremely high resolution is required and delay elements of high accuracy and stability are needed. Conventional delay elements are mere printed circuits, LC transmission lines, CR transmission lines, gate circuits and so forth. It is difficult, however, to accurately maintain the delay time of each delay element untouched by aging and environmental variations such as a temperature change. In addition, delay elements which are insusceptible to such variations and high in precision are expensive, and the prior art requires such costly delay elements for the both fine delay circuits 14 and 18.

SUMMARY OF THE INVENTION

It is therefore an object of the present invention to provide a timing generating device which is able to generate periods and phases with high resolution, small in the number of delay elements used, relatively simple in structure and high precision.

According to this invention, a period generator yields pulses, the average period of which is equal to a preset period, at intervals of an integral multiple of a reference clock period, and fractional period data indicating the phase difference between the above said pulses and pulses of the preset period on a pulse-wise basis. The former pulses are delayed by a coarse delay means in units of the reference clock in accordance with a preset delay time, obtaining delayed pulses. On the other hand, data in the preset delay data which is of a weight smaller than the reference clock period (i.e. fractional delay data), and the fractional period data from the period generator are added together by an adder. The above delayed pulses are delayed by a fine delay circuit for a period corresponding to the added value, thus creating timing signals.

DESCRIPTION OF THE PREFERRED EMBODIMENTS

Figure 1:
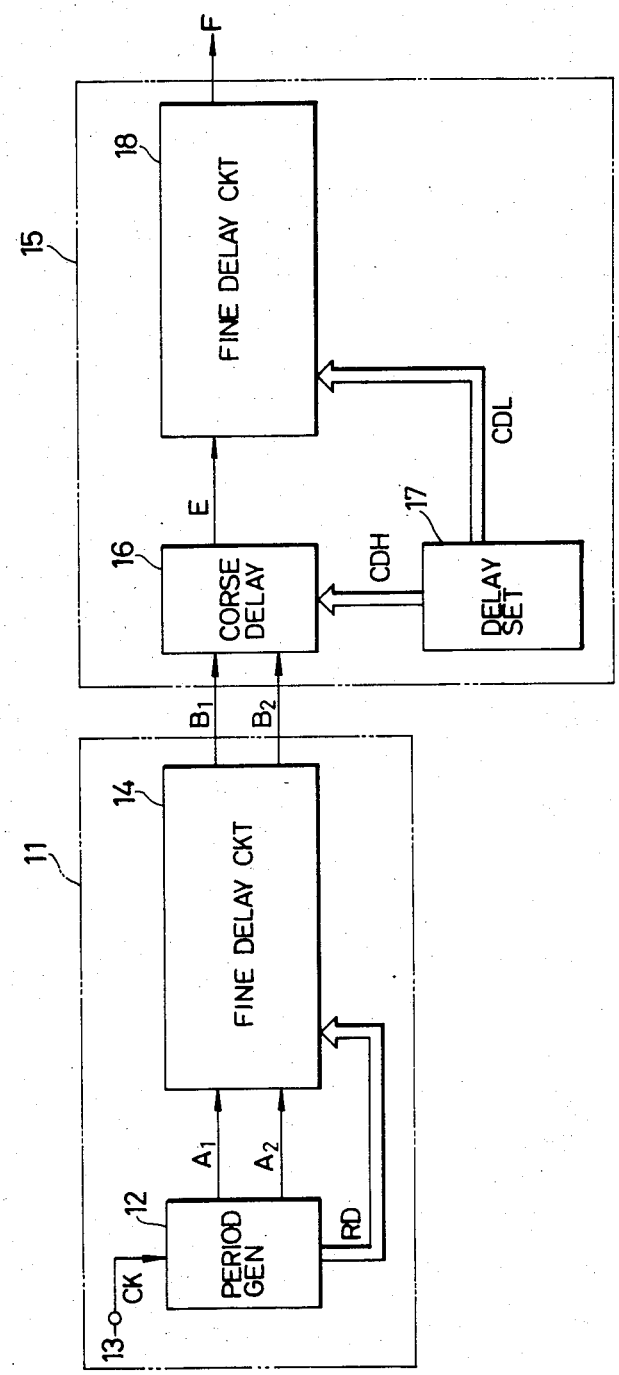
FIG. 1 is a block diagram showing a conventional timing generating device.
Figure 3:
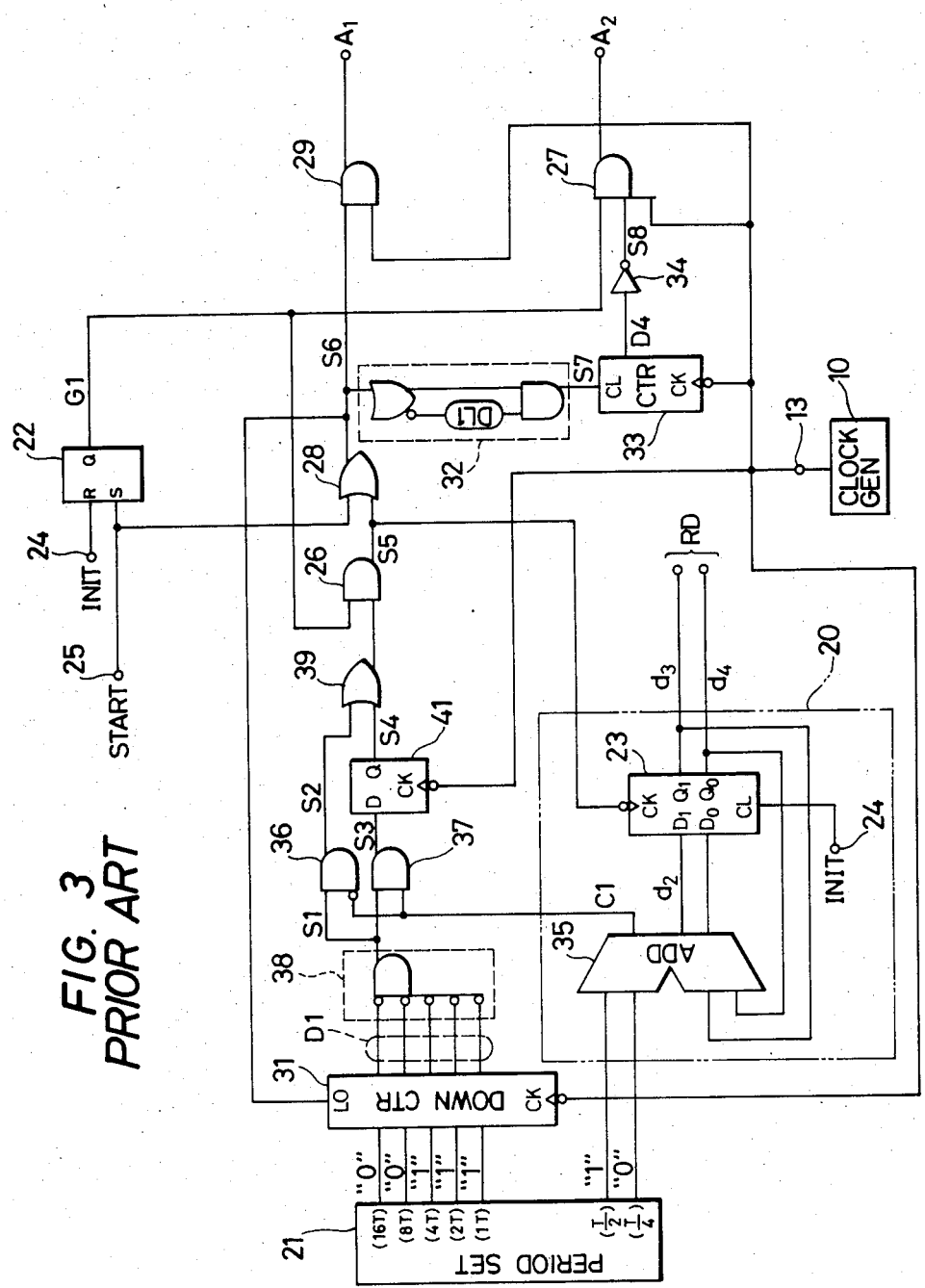
FIG. 3 is a logic circuit diagram illustrating a specific operative example of a period generator 12 used in FIG. 1.
Figure 10:
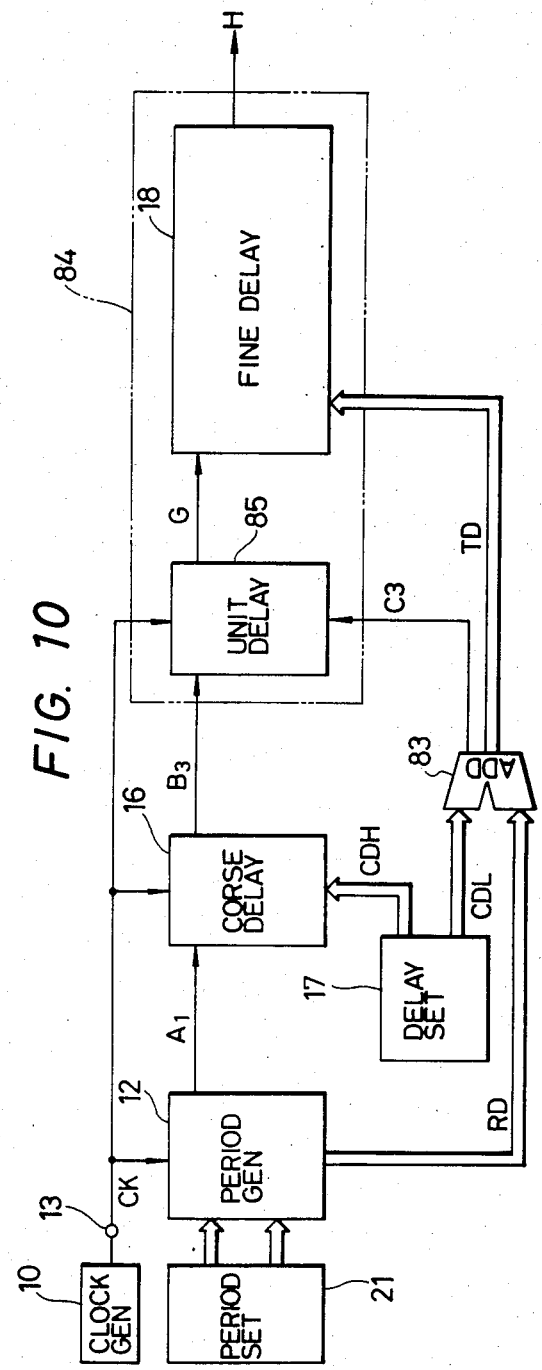
FIG. 10 is a block diagram illustrating an example of the timing generating device of the present invention.

FIG. 10 illustrates an embodiment of the present invention, in which the parts corresponding to those in FIG. 1 are identified by the same reference numerals. The period generator 12 receives period data corresponding to the period $(m+k)T$ (where $m=1, 2, 3, \ldots$ and $0 \leq k < 1$) set in the period setting means 21 and the reference clock CK, and generates the pulses $A_1$ which have an instantaneous period which is an integral multiple of the reference clock period T and an average period which is equal to the set period $(m+k)T$ and the fractional period data RD which indicates the phase difference between each of the pulses $A_1$ and each pulse of the set period $(m+k)T$. The period generator 12 may be the same as that shown in FIG. 3, but in the present invention only the pulses $A_1$ and the fractional period data RD are utilized, so the part for creating the pulses $A_2$ in FIG. 3 is left out.

The pulses $A_1$ from the period generator 12 are each delayed by the coarse delay circuit 16 which uses a counter in accordance with the high order delay data CDH of the delay setting means 17. In this instance, according to the present invention, the counter is initialized by the pulse $A_1$ and starts counting the reference clock pulses from the terminal 13. The coarse delay circuit 16 provides a pulse $B_3$ delayed by nT (where n is a positive integer including zero) relative to the pulse $A_1$. To perform this, the high order delay data CDH which is provided from the delay setting means 17 to the coarse delay circuit 16 is represented by five bits $b_1$, $b_2$, $b_3$, $b_4$ and $b_5$ which are weighted by 16T, 8T, 4T, 2T and T, respectively.

The fractional delay data CDL contained in the delay data available from the delay setting means 17 and the fractional period data RD are added together by an adder 83. In this embodiment the fractional delay data CDL is represented by two bits, $b_6$ and $b_7$ which are weighted by T/2 and T/4, respectively. The output delayed pulse $B_3$ from the coarse delay circuit 16 is further delayed in a fine delay section 84 in accordance with the added output of the adder 83. In the fine delay section 84, upon generation of a carry output $C_3$ from the adder 83, the delayed pulse $B_3$ is delayed by a unit delay circuit 85 for T, thereafter being applied to the fine delay circuit 18. In the absence of the carry output $C_3$, the delayed pulse $B_3$ is provided via the unit delay circuit 85 to the fine delay circuit 18 without being delayed. The fine delay circuit 18 is identical in construction with that shown in FIG. 9 and its delay time is controlled by the added output TD of the adder 83 except that the output G of the unit delay circuit 85 is directly supplied to both the gates 71 and 72 and those gates 67, 68, 75 and the delay element 78 are dispensed with because the control of unit delay time T corresponding to bit $b_5$ is carried out in the coarse delay circuit 16.

Figure 2:
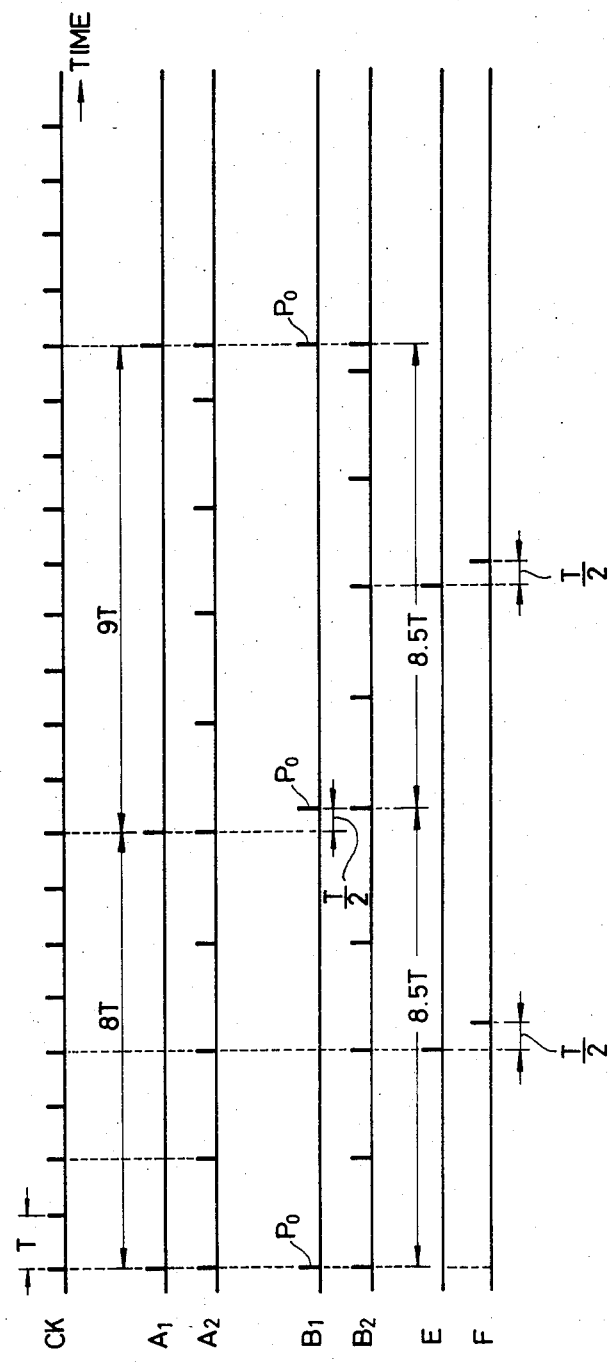
FIG. 2 is a timing chart showing an example of the operation of the device depicted in FIG. 1.
Figure 11:
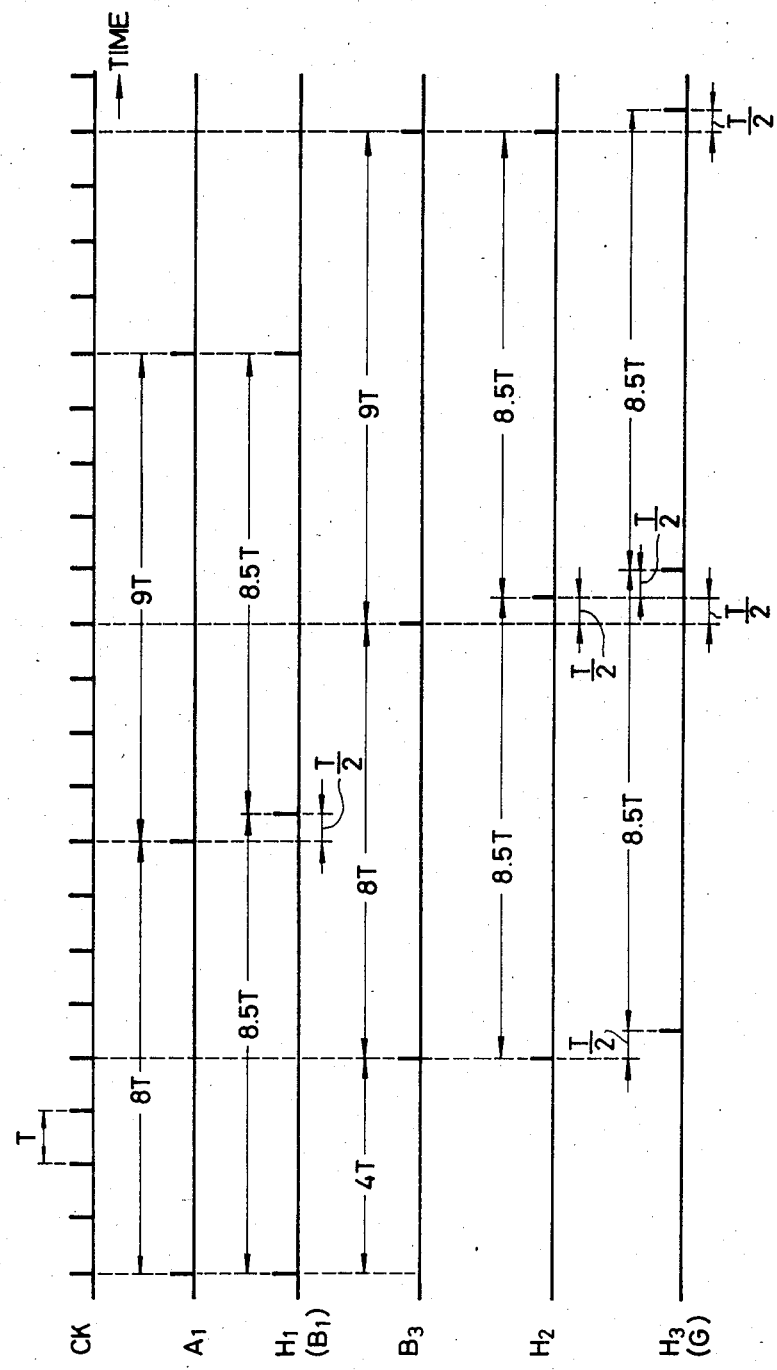
FIG. 11 is a timing chart showing examples of various operations of the device depicted in FIG. 10.

To facilitate a better understanding of the operation of the device depicted in FIG. 10, a description will be given of various examples thereof with reference to FIG. 11. Now, let it be assumed that the set period $(m+k)T=(8+0.5)T=8.5T$ and the set delay $(n+i)T=(0+0)T=0$ in the arrangement of FIG. 10. The period generator 12 yields the pulses A1 of an average period equal to the set period $(m+k)T=8.5T$, as shown in FIG. 11, at intervals of an integral multiple of the reference clock period T, as described previously in connection with FIGS. 1 and 3. The period generator 12 further provides the fractional period data RD indicating an accumulated value of kT, but in this example, since $k=0.5$, the fractional period data RD indicating 0T or 0.5T is provided upon each occurrence of the pulse $A_1$. The pulse $A_1$ occurring after the interval (the instantaneous period) 9T is followed by the pulse $A_1$ with the fractional period data RD indicating 0.5T. Since the set delay time $(n+i)T=0$, the pulse $A_1$ is supplied to the fine delay section 84 without being delayed by the coarse delay circuit 16. Furthermore, since $iT=0$, the fractional period data RD is yielded as the output of the adder 83 and the carry output $C_3$ is always zero, so the output TD is equal to the data RD. Accordingly, the pulse $(A_1)$ entered into the fine delay section 84 is applied to the fine delay circuit 18 without being delayed by the unit delay circuit 85. The fine delay circuit 18 delays the input pulse by T/2 only when the fractional period data RD corresponds to 0.5T. As a result of this, the output timing pulses are such as indicated by $H_1$ in FIG. 11. The pulses $H_1$ coincide with the pulses $B_1$ shown in FIG. 2. In this way, according to the present invention, the operation of the fine delay circuit 14 in the conventional device (shown in FIG. 1) is performed by the fine delay circuit 18.

Next, in the case where the set period is given by $(m+k)T=(8+0.5)T=8.5T$ and the set delay amount $(n+i)T=(4+0)T=4T$, the period generator 12 creates the pulses $A_1$ of instantaneous periods (at intervals of) 8T and 9T alternately and the fractional period data RD indicating 0T and 0.5T, as in the above. Since the coarse delay data (the high order bit data) CDH in the output of the delay setting means 17 is indicative of $nT=4$, the pulses $A_1$ are each delayed by the coarse delay circuit 16 for 4T and output as a pulse $B_3$, as depicted in FIG. 11. Since $iT=0$, the output of the adder 83 is equal to the fractional period data RD as in the above. Consequently, the pulses $B_3$ entered into the fine delay section 84 are alternately delayed by 0.5T, as indicated by $H_2$ in FIG. 11, and provided as timing pulses.

Next, in the case where the set period is $(m+k)T=(8+0.5)T=8.5T$ and the set delay amount is $(n+i)T=(4+0.5)T=4.5T$, the period generator 12 generates the same pulses A1 and fractional period data RD as those described above and the coarse delay circuit 16 yields the pulses $B_3$ obtained by delaying the pulses $A_1$ by $nT=4T$. In the adder 83 the fractional delay data CDL indicating $iT=0.5T$, available from the delay setting means 17, and the fractional period data RD are added together. In this instance, however, since the fractional period data RD is 0T and 0.5T alternately every other pulse $A_1$, the adder 83 outputs data corresponding to 0.5T and 1.0T alternately, that is, data TD corresponding to the carry output $C_3=0$ and 0.5 and data TD indicating the carry output $C_3=1$ and 0 alternately. Accordingly, the pulses $B_3$ are delayed for 0.5T in the fine delay section 84 when the carry output $C_3=0$, as indicated by $H_3$ in FIG. 11, and for 1.0T in the unit delay circuit 85 when the carry output $C_3=1$, and they are not delayed by the fine delay circuit 18 and provided as timing pulses. In short, in the fine delay section 84 the pulses $B_3$ are each delayed by the delay amount $iT=0.5T$ in accordance with the fractional delay data CDL from the delay setting means 17 at all times and are selectively delayed in accordance with the fractional period data RD.

Figure 7:
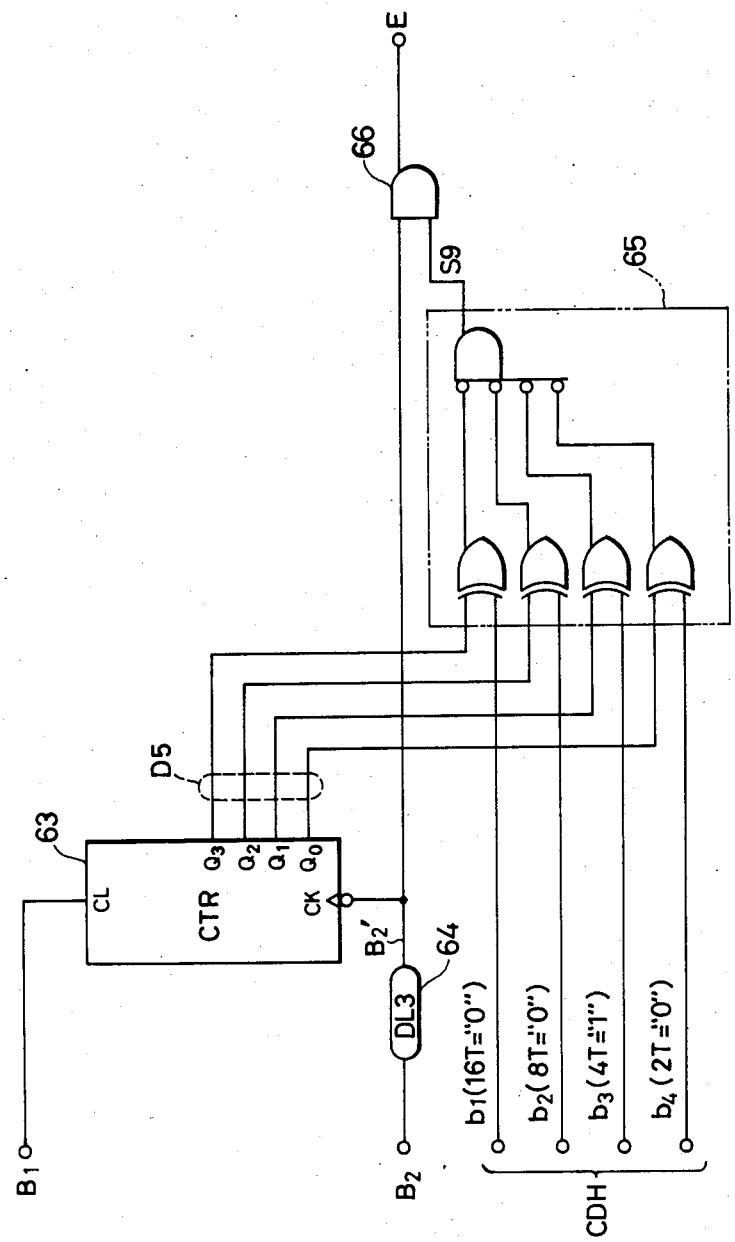
FIG. 7 is a logic circuit diagram illustrating a specific operative example of a coarse delay circuit 16 employed in FIG. 1.
Figure 8:
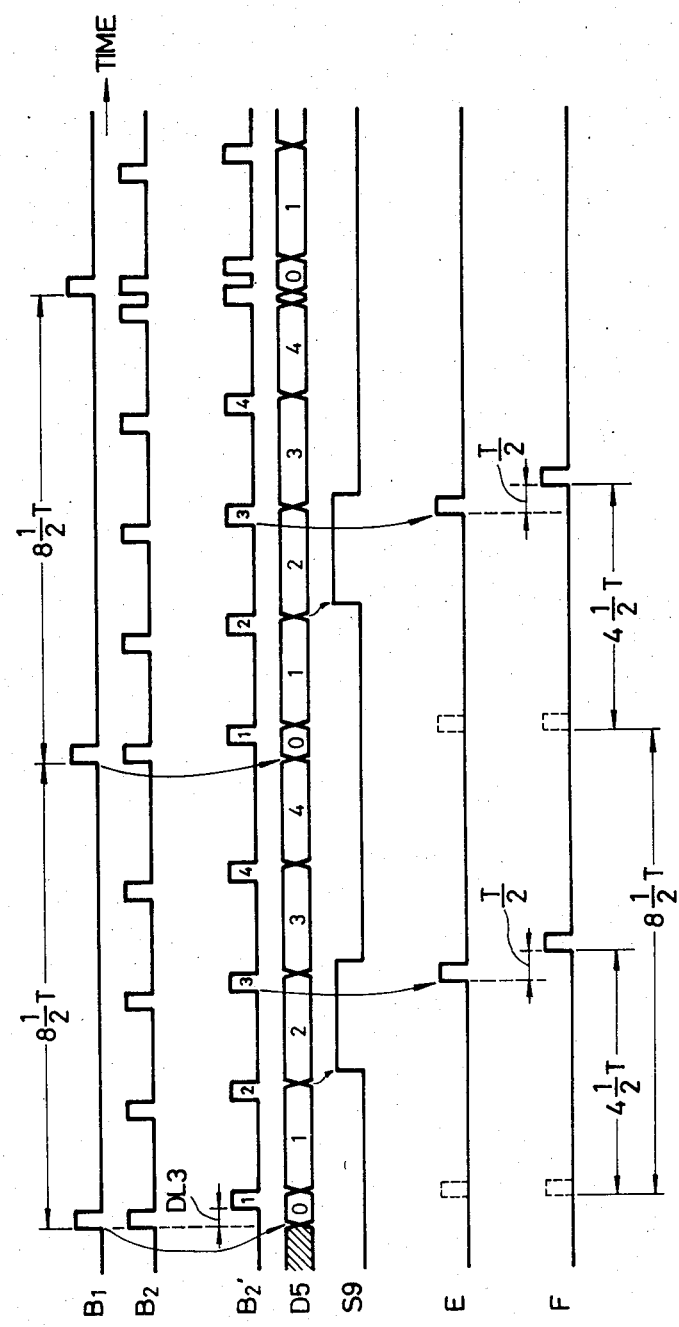
FIG. 8 is a timing chart showing an example of the operation of the coarse delay circuit 16 depicted in FIG. 7.
Figure 12:
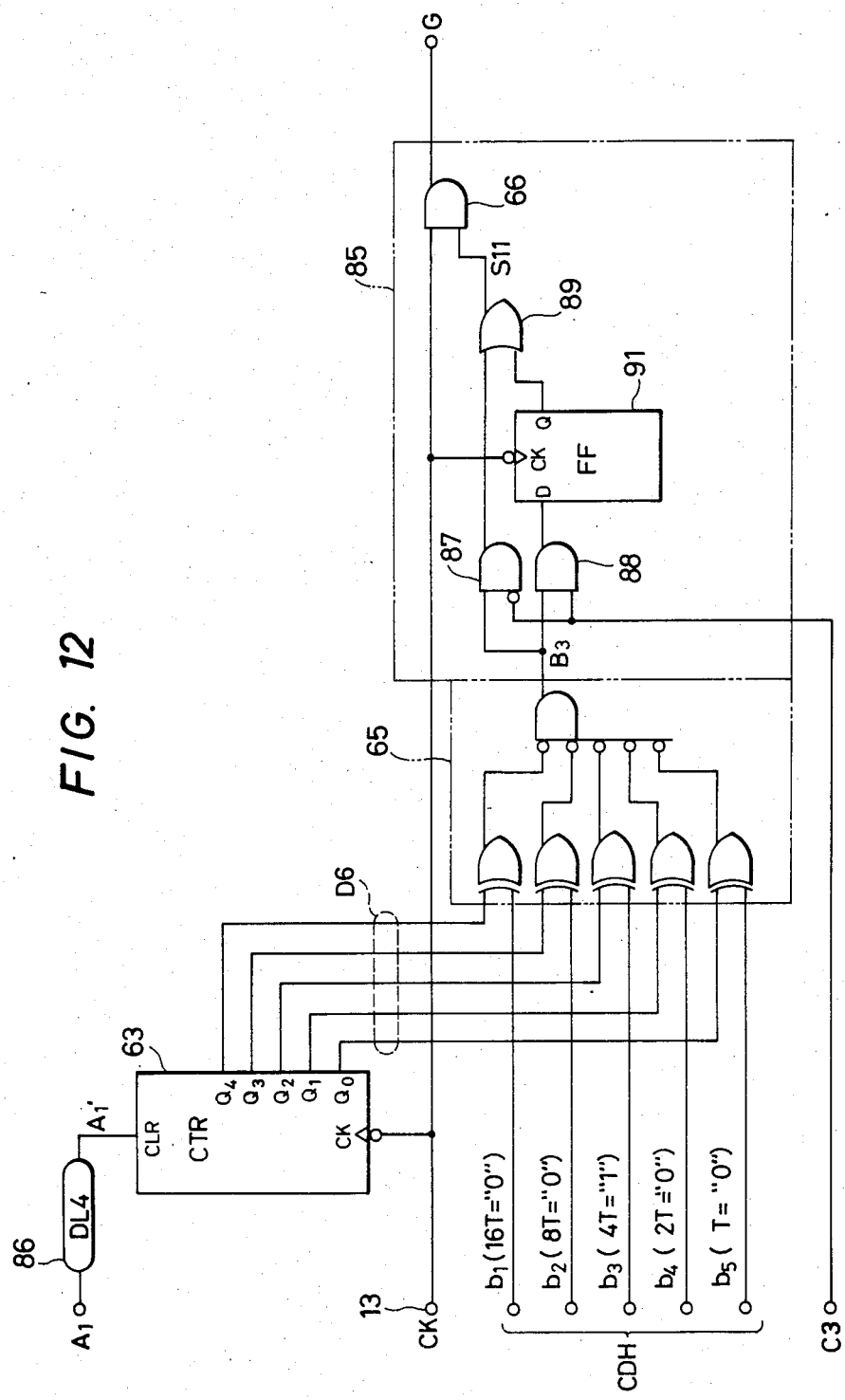
FIG. 12 is a logic circuit diagram illustrating specific operative examples of the coarse delay circuit 16 and a unit delay circuit 85 used in FIG. 10.

FIG. 12 illustrates specific operative examples of the coarse delay circuit 16 and the unit delay circuit 85. The coarse delay circuit 16 is substantially identical in construction to that shown in FIG. 7, but its counter 63 is supplied at the clock terminal with the reference clock pulses CK from the terminal 13 and the pulses $A_1$ are each delayed by a delay circuit 86 for a period substantially equal to the pulse width of the pulse $A_1$, thereafter being applied as pulses $A_1'$ to the clear terminal of the counter 63. The count value $D_6$ of the counter 63 and the high order bits $b_1$ to $b_5$ (the coarse delay data CDH) in the delay data from the delay setting means 17 are compared by the coincidence detector 65 and in the case of coincidence, the coincidence detected output is provided to gates 87 and 88 in the unit delay circuit 85. In the absence of the carry output $C_3$ from the adder 83, the gate 87 is enabled, whereas in the presence of the carry output $C_3$, the gate 88 is enabled. The output of the gate 87 is provided via an OR gate 89 to the gate 66. The output of the gate 88 is applied to a D flip-flop 91 and input thereinto by the reference clock pulse CK from the terminal 13. The output of the flip-flop 91 is provided to the OR gate 89. The gate 66 is being supplied with the reference clock pulses CK.

Figure 13:
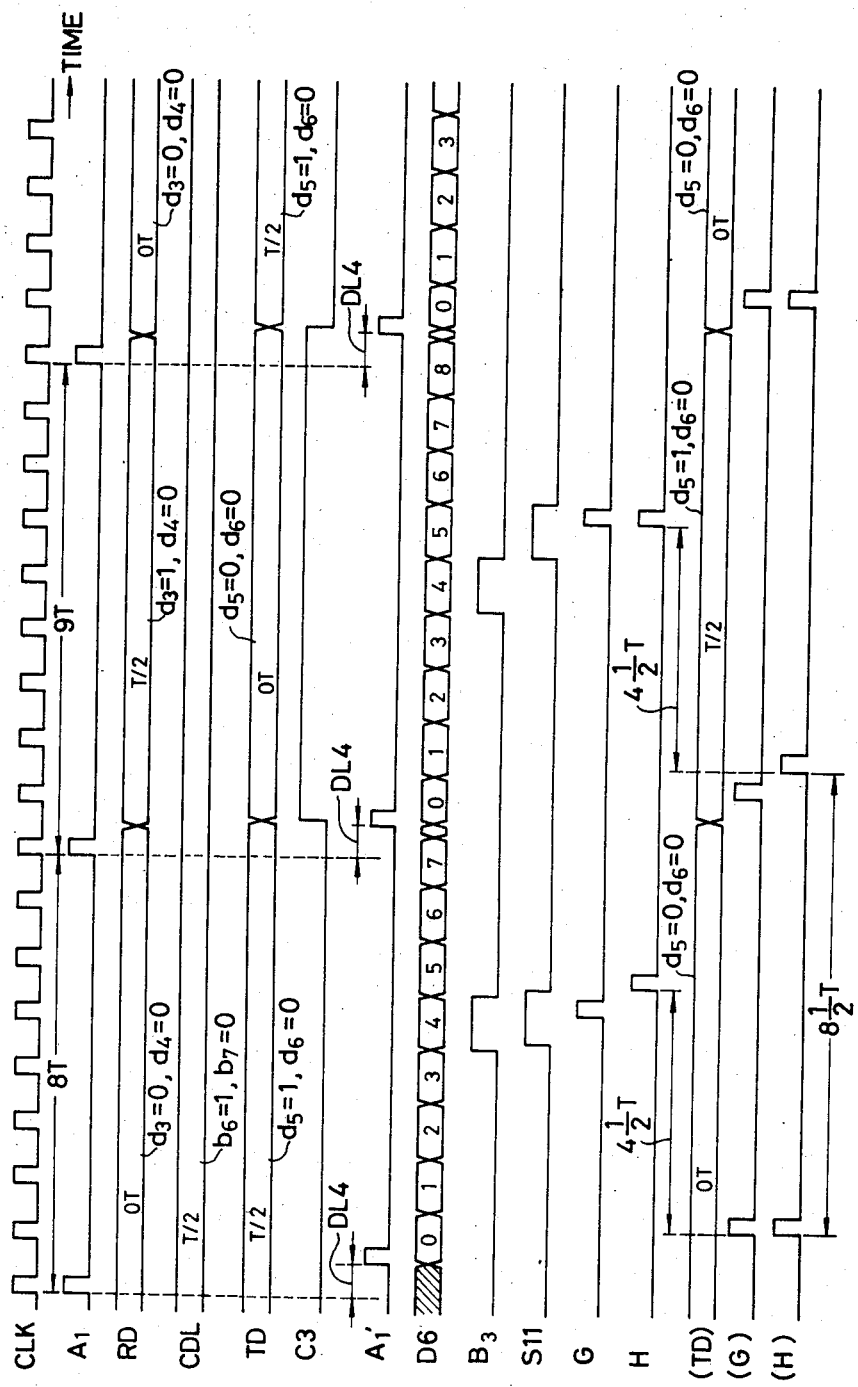
FIG. 13 is a timing chart showing a specific operative example of the operation of the device depicted in FIGS. 10 and 12.

FIG. 13 illustrates, by way of example, operations of this embodiment in the case where the set period is $(m+k)T=(8+0.5)T=8.5T$ and the set delay amount is $(n+i)T=(4+0.5)T=4.5T$ as described previously in connection with the prior art. In FIG. 10 the reference clock pulses CK are supplied to the period generator 12, which operates in the same manner as in the case of FIG. 3 to produce the pulses $A_1$ at intervals of 8T and 9T alternately and provide, as the fractional period data RD, $d_3=0$ and $d_4=0$ (0T) during the period 8T of the pulse $A_1$ and $d_3=1$ and $d_4=0$ (0.5T) during the period 9T of the pulse $A_1$. The pulse $A_1$ is delayed by the delay circuit 86 into the pulse $A_1'$, by which the counter 63 is cleared to zero, causing it to start counting the reference clock pulses CK. When its count value $D_4$ is incremented to 4, its coincidence with the coarse delay data CDH (the high order bits $b_1=0$, $b_2=0$, $b_3=1$, $b_4=0$, $b_5=0$) of the set delay amount is detected by the coincidence detector 65, yielding the delayed pulse $B_3$ from the coarse delay circuit 16.

The adder 83 adds together the fractional delay data CDL (the low order bits $b_6=1$, $b_7=0$) of the set delay amount and the fractional period data RD from the period generator 12. The adder output TD is $d_5=1$ and $d_6=0$ during the period 8T of the pulses $A_1$ and $d_5=0$ and $d_6=0$ during the period 9T. The carry output $C_3$ goes to "0" during the period 8T and "1" during the period 9T. Therefore, in the period 8T of the pulses $A_1$ the delayed pulse $B_3$ is applied as a pulse $S_{11}$ to the gate 66 via the gates 87 and 89. When the gate 66 is enabled by the pulse $S_{11}$, the reference clock pulse CK is produced as a pulse G. In the period 9T of the pulses $A_1$ the delayed pulse $B_3$ is fed via the gate 88 to the D flip-flop 91, wherein it is delayed by the period T, thereafter being applied as the pulse $S_{11}$ to the gate 66 to enable it. Thus the pulse G is delayed for 5T and 6T alternately every other pulse $A_1$ and its period repeats 8T and 9T alternately.

The pulses G are delayed by the output TD of the adder 83 in the fine delay circuit 18. In this instance, since the adder 83 outputs $d_5=1$, $d_6=1$ and $d_5=0$, $d_6=0$ alternately as mentioned previously, the pulses G are alternately delayed for 0.5T, so the period of the output pulses H of the fine delay circuit 18 is 8.5T.

Incidentally, in the case where the set delay amount $(n+i)T$ is zero, that is, the bits $b_1$ to $b_7$ are all "0s", and the set period $(m+k)T$ is 8.5T, the output (TD) of the adder 83 repeats $d_5=0$, $d_6=0$ and $d_5=1$, $d_6=0$ alternately, the output pulses (G) of the unit delay circuit 85 are delayed T behind each pulse $A_1$ and the pulses G are alternately delayed by the fine delay circuit 18 for 0.5T, providing pulses (H) having a period of 8.5T, as indicated by (TD), (G) and (H) in FIG. 13. It will be seen that the pulses H are delayed 4.5T behind the pulses (H) and are the pulses desired to obtain.

That is to say, in order to utilize the fine delay circuit 18 for both period generation and delay setting purposes so that the operation of the period generator 11 in the prior art is performed by the period generator 12 and the fine delay circuit 18 and the delay of a preset amount is effected by the coarse delay circuit 16 and the fine delay circuit 18, the fractional period data RD and the fractional delay data CDL are added together by the adder 83, the fine delay circuit 18 is controlled by the adder output and a unit delay according to a carry of the addition is done by the unit delay circuit 85.

Figure 14:
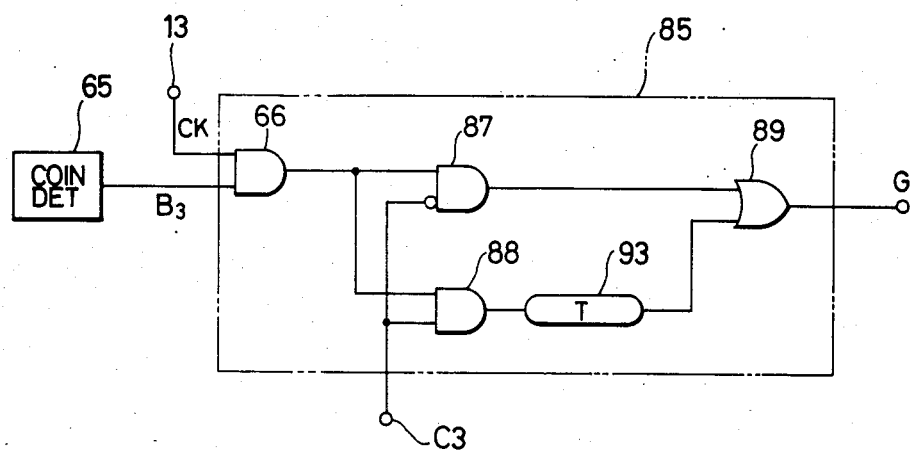
FIG. 14 is a logic circuit diagram illustrating another example of the unit delay circuit 85.

The unit delay circuit in FIGS. 10 and 12 can be formed using not only the flip-flop 91 but also a delay element of the delay time T. That is, it is necessary only to connect a delay element 93 of the delay time T, in place of the flip-flop 91, between the gate 88 and the OR gate 89 in FIG. 12. In addition, the gate 66 may be moved to the input side of the unit delay circuit 85 as depicted in FIG. 14. In this instance, therefore, by connecting the gate 66 between the output side of the coincidence detector 65 and input terminal E shown in FIG. 14, the gate 67, 68, 75 and the delay element 78 can be used as the unit delay circuit 85 provided that the gates 67 and 68 are controlled by the carry $C_3$ instead of $b_5$.

Figure 15:
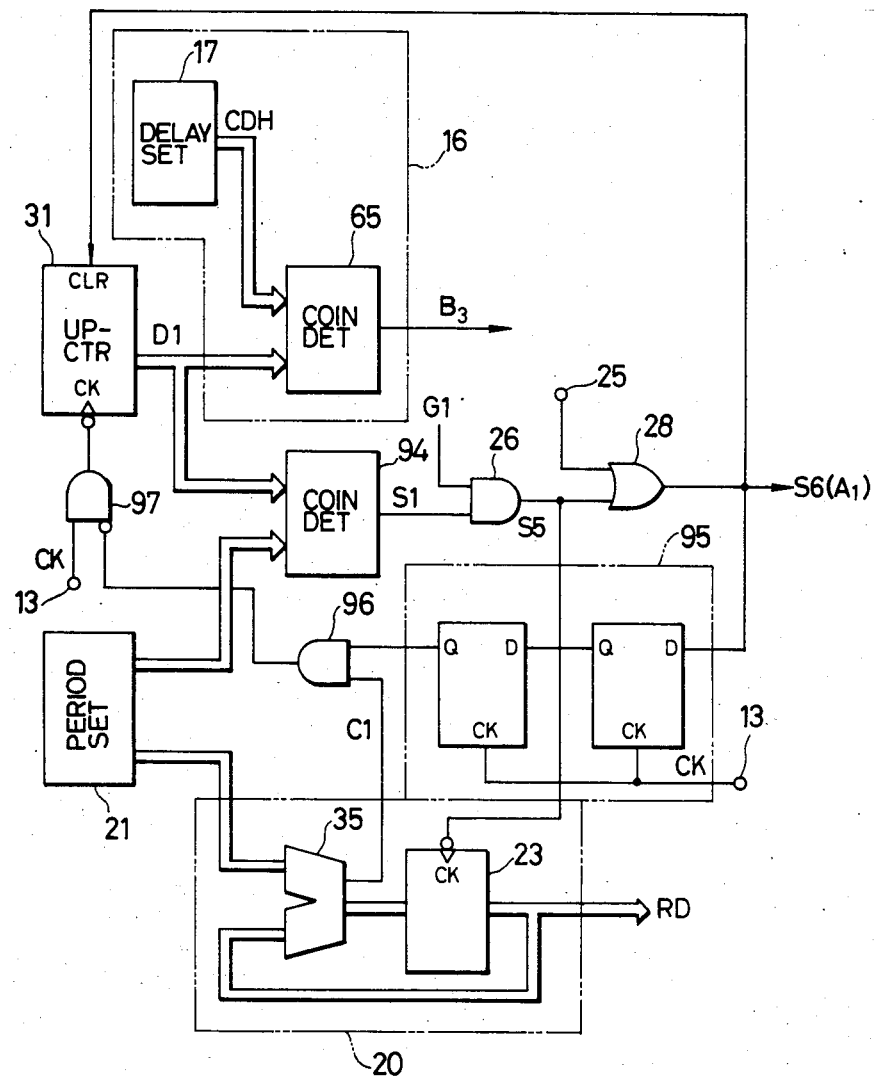
FIG. 15 is a logic circuit diagram illustrating a part of another example of the period generator 12 and another example of the coarse delay circuit 16.

Since the coarse delay circuit 16 is to delay the pulses $A_1$ in units of the reference clock period T, the operation of the counter 63 in FIG. 12 may also be performed by the counter 31 (FIG. 3) in the period generator 12. For instance, as depicted in FIG. 15, the counter 31 (FIG. 3) in the period generator 12 is formed by an up counter, which is cleared by the pulse $A_1$ from the period generator 12 (in this example, by the output $S_6$ of the OR gate 28) for initialization. The count value $D_1$ of the counter 31 and coarse period data indicating mT in the period set in the period setting means 21 are compared by a coincidence detector 94, and when coincidence is detected between them, the output $S_1$ goes to the high level. In this way, the pulse $A_1$ is obtained. The count value $D_1$ of the up counter 31 is applied as well to the coincidence detector 65 of the coarse delay circuit 16, wherein it is compared with the coarse delay data CDH, and when coincidence is detected between them, the output $B_3$ is made high-level. Thus the pulse $B_3$ is obtained which is delayed by nT in the set delay data relative to the pulse $A_1$. In short, the coarse delay circuit 16 needs only to create the pulse $B_3$ delayed by nT relative to the pulse $A_1$ as well as to delay the pulse $A_1$ from the period generator 12 by nT.

Figure 4:
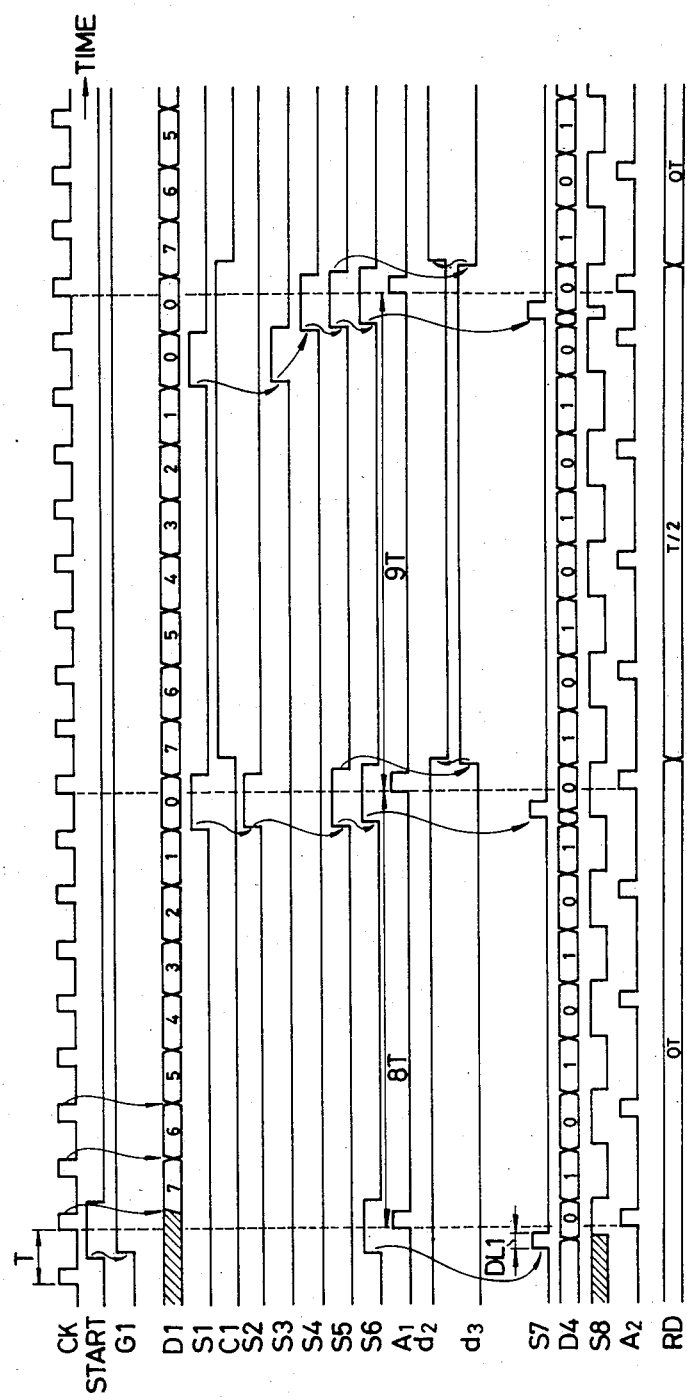
FIG. 4 is a timing chart for explaining the operation of the period generator 12 shown in FIG. 3.
Figure 5:
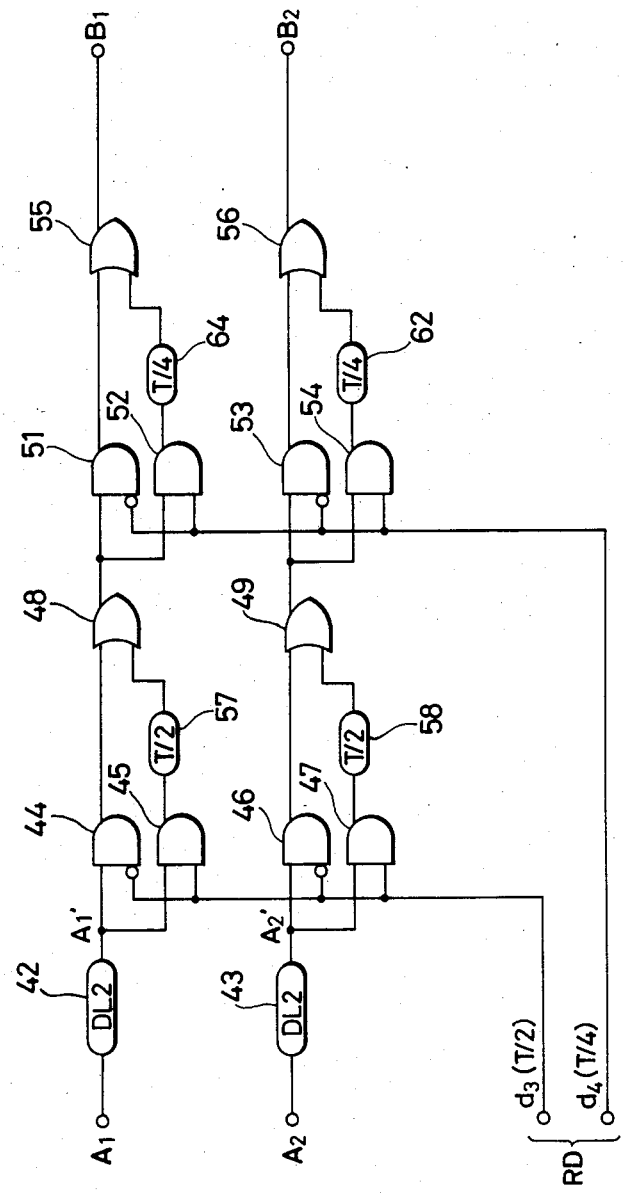
FIG. 5 is a logic circuit diagram illustrating an example of a fine delay circuit 14 utilized in FIG. 1.
Figure 6:
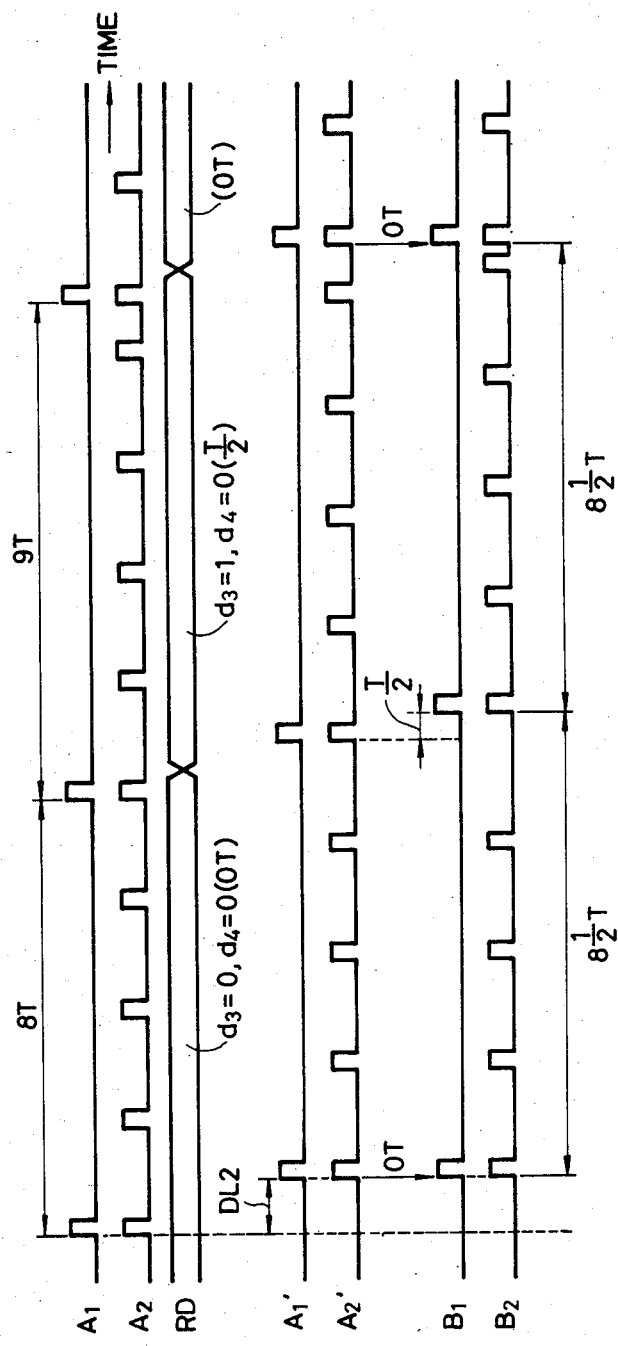
FIG. 6 is a timing chart showing an example of the operation of the fine delay circuit 14 depicted in FIG. 5.

While in the period generator 12 in FIG. 3 the detected output $S_1$ of the zero detector 38 is delayed by T upon each occurrence of the carry output $C_1$ from the accumulator 20 for the purpose of delaying the next pulse $A_1$ by one reference clock period T, it is also possible to serve the purpose by inhibiting the counter 31 from counting one of the reference clock pulses CK. This will be described with respect to the case of FIG. 15. As will be seen from the timing chart depicted in FIG. 4, it is necessary only to inhibit one of the reference clock pulses CK which are provided to the counter 31 in the period from the time when the carry output $C_1$ goes to the high level to the time when the output $S_1$ of the detector 38 goes to the high level next. This can be achieved in such a manner as follows: The output $S_1$ of the coincidence detector 94 is supplied directly to the gate 26, the output of which is provided to the OR gate 28, the output $S_6$ of which is, in turn, delayed by twice the reference clock period T in a delay circuit 95. The delayed output and the carry output $C_1$ are ANDed by a gate 96, by the output of which an inhibit gate 97 connected in series with the clock input terminal of the counter 31 is controlled to enable.

It will easily be understood that also in FIG. 3 a similar arrangement can be obtained by directly applying the output $S_1$ of the detector 94 to the gate 26 and by providing the delay circuit 95 and the gates 96 and 97. Furthermore, in the case of forming the counter 31 by an up counter and employing the coincidence detector 94 as shown in FIG. 15, it is also possible to adopt an arrangement wherein the delay circuit 95 and the gates 96 and 97 are omitted and the output $S_1$ of the coincidence detector 94 is applied to the gates 36 and 37, as depicted in FIG. 3.

The counter 31 in FIG. 3 and the counter 63 in FIG. 12 are to detect the number of clock pulses corresponding to the value mT in the set period and the number of clock pulses corresponding to the value nT in the set delay amount, respectively. For detecting the preset numbers by these counters, it is possible to employ either a means for detecting a borrow output through use of a down counter or a means for detecting the carry output after presetting a complement of the maximum count value of the counter other than the means for detecting zero through use of a down counter and the means for detecting coincidence through use of an up counter as referred to previously. Also in the case of FIG. 15, the detection by the counter 31 can be effected by any of the above means. In such a case, it is necessary only to arrange the delay setting means 17 so that it provides the coarse delay data CDH in accordance with the particular means used.

Figure 9:
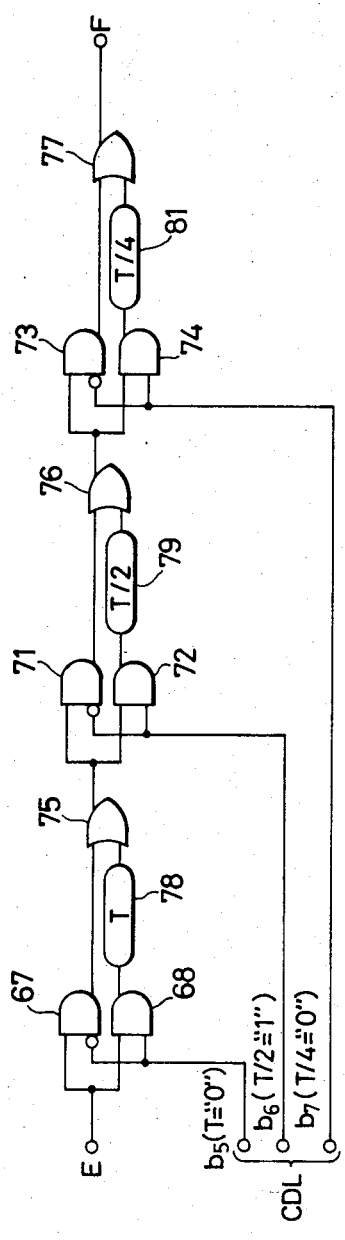
FIG. 9 is a logic circuit diagram illustrating a specific operative example of a fine delay circuit 18 used in FIG. 1.
Figure 16:
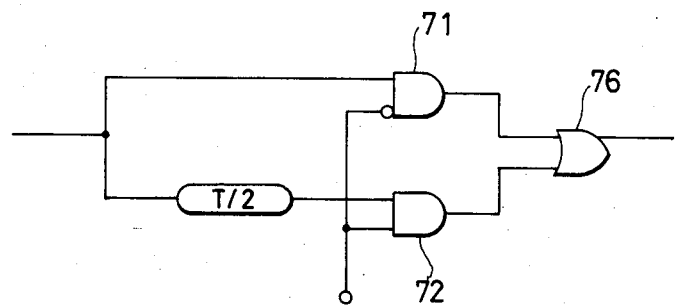
FIG. 16 is a logic circuit diagram illustrating another example of a delay switching means in the fine delay circuit 18.

Each delay switching stage in the fine delay circuit 18, for instance, the delay switching stage made up of the gates 71, 72 and 76 and the delay element 79 in FIG. 9, needs only to output the input pulse after or without delaying it in response to the corresponding bit $b_6$ contained in the input fractional delay data CDL. Therefore, the gate 72 and the delay element 79 may also be exchanged, for example, as depicted in FIG. 16. Similarly the gate 37 and the flip-flop 41 may be exchanged in FIG. 3 and the gate 88 and the flip-flop 91 may be exchanged in FIG. 12.

As described above, the timing generating device of the present invention calls for only one fine delay circuit, and hence is correspondingly small in the number of unstable elements used, high in stability and precision, as compared with the conventional timing generating device which employs two fine delay circuits as shown in FIG. 1. In addition, one of the two fine delay circuits is required to effect delay control of the period 2T or less. In contrast thereto, the device of the present invention needs only to perform delay control of the period T or less, and hence is small in the number of delay switching stages and is stable.

It will be apparent that many modifications and variations may be effected without departing from the scope of the novel concepts of the present invention.

What is claimed is:

1. A timing generating device for generating timing pulses of a preset period and phase, comprising:
   a clock generator for generating reference clock pulses of a period T;
   a period setting means in which a period to be generated, $(m+k)T$ (where m is an integer greater than 1 and $0 \leq k < 1$), is set, for producing preset period data;
   a period generator which receives the preset period data from the period setting means and the reference clock pulses from the clock generator, generates a pulse upon each counting of the reference clock pulses by the number corresponding to the m, outputs fractional period data indicative of an accumulated value of the k upon each occurrence of the pulse and delays the generation of the pulse by one reference clock period each time the accumulated value exceeds the period T;
   a delay setting means in which a delay time to be provided, $(n+i)T$ (where n is 0 or a positive integer and $\leq i < 1$), is set, for providing coarse delay data indicating a delay time nT and fractional delay data indicating a delay time iT;
   a coarse means connected to the delay period generator, for creating a pulse delayed for the time nT relative to the pulse provided from the period generator;
   an adder for adding together the fractional period data from the period generator and the fractional delay data from the delay setting means; and
   a fine delay section which is supplied with the output of the adder and the delayed pulse from the coarse delay means and further delays the delayed pulse for a time corresponding to the added output of the adder, producing a timing pulse.

2. A timing generating device according to claim 1 wherein the fine delay section is comprised of a series connection of:
   a unit delay means which is controlled by a carry bit in the added output of the adder and delays the input pulse by the period T when a carry is made but does not delay the input pulse when no carry is made; and
   a fine delay circuit which is composed of a series connection of a plurality of delay switching stages, each including a series connection of a switching means which is controlled by one of bits other than the carry bit in the added output of the adder and a delay element which provides a delay smaller than the period T, corresponding to the weight of the bit.

3. A timing generating device according to claim 2 wherein the unit delay means comprises a flip-flop which is provided at the input side of the fine delay circuit, reads said input pulse by the reference clock and yields a pulse delayed by the period T to said fine delay circuit, and a switching means which is controlled by said carry bit to selectively bypass said flip-flop, said input pulse and the T-delayed pulse from the flip-flop.

4. A timing generating device according to claim 2 wherein the unit delay means comprises a series circuit of a switching means which is controlled by the carry bit and a delay element for providing a delay of the period T, the series circuit being connected in series with the delay switching stages of the fine delay circuit.

5. A timing generating device for generating timing pulses of a preset period and phase, comprising:
   a clock generator for generating reference clock pulses of a period T;
   a period setting means in which a period to be generated, $(m+k)T$ (where m is an integer greater than 1 and $0 \leq k < 1$), is set, for producing preset period data;
   a period generator which receives the preset period data from the period setting means and the reference clock pulses from the clock generator, yields pulses the average period of which is equal to the preset period $(m+k)T$, at intervals of an integral multiple of the period T, and outputs fractional period data indicative of the phase difference between the pulses of said average period and pulses of the preset period upon each occurrence of them;
   a delay setting means in which a delay time to be provided, $(n+i)T$ (where n is 0 or a positive integer and $0 \leq i < 1$), is set, for providing coarse delay data indicating a delay time nT and fractional delay data indicating a delay time iT;
   a coarse delay means connected to the period generator, for creating a pulse delayed for the time nT relative to the pulse provided from the period generator;
   an adder for adding together the fractional period data from the period generator and the fractional delay data from the delay setting means; and
   a fine delay section which is supplied with the output of the adder and the delayed pulse from the coarse delay means and further delays the delayed pulse for a time corresponding to the added output of the adder, producing a timing pulse.

6. A timing generating device according to claim 5 wherein the period generator comprises a counter for counting the reference clock pulses, the counter being initialized by each of the pulses of the average period equal to the preset period; a detecting means for creating a pulse upon detecting that the counter has counted, from its initial state, the reference clock pulses by the number corresponding to the value m; an accumulator for accumulating the data kT from the period setting means upon each occurrence of the pulse of the average period equal to the preset period; and a means for being controlled by a carry output of the accumulator, so that the output pulse of the detecting means is provided as the pulse of the average period equal to the preset period when no carry output is yielded but the output of the detecting means is delayed by the period T when the carry output is produced, the output of the accumulator, except its carry output, being provided as the fractional period data.

7. A timing generating device according to claim 6 wherein the coarse delay means comprises a counter which is initialized by each of the pulses of the average period equal to the preset period and counts the reference clock pulses, and a detecting means for yielding the delayed pulse upon detecting that the counter has counted the reference clock pulses by the number n.

8. A timing generating device according to claim 6 wherein the coarse delay means is a coincidence detecting means for comparing the count value of the counter and the coarse delay data from the delay setting means and yielding the delayed pulse when they coincide with each other.

9. A timing generating device according to claim 1 wherein the period generator comprises a counter for counting the reference clock pulses, the counter being initialized by each of the pulses of the average period equal to the preset period; a detecting means for creating the pulse of the average period equal to the preset period upon detecting that the counter has counted, from its initial state, the reference clock pulses by the number corresponding to the value m; an accumulator for accumulating the data kT from the period generator upon each occurrence of the pulse of the average period equal to the preset period; and a means for inhibiting, by a carry output of the accumulator, the counter from one counting of the reference clock pulse upon each occurrence of the pulse of the average period equal to the preset period when the carry is made, the output of the accumulator, except the carry output, being provided as the fractional period data.

10. A timing generating device according to claim 9 wherein the coarse delay means comprises a counter which is initialized by each of the pulses of the average period equal to the preset period and counts the reference clock pulses, and a means for yielding the delayed pulse upon detecting that the counter has counted the reference clock pulses by the number n.

11. A timing generating device according to claim 9 wherein the coarse delay means is a coincidence detecting means for comparing the count value of the counter and the coarse delay data from the delay setting means and yielding the delayed pulse when they coincide with each other.

12. A timing generating device according to claim 2 wherein the period generator comprises a counter for counting the reference clock pulses, the counter being initialized by each of the pulses of the average period equal to the preset period; a detecting means for creating the pulse of the average period equal to the preset period upon detecting that the counter has counted, from its initial state, the reference clock pulses by the number corresponding to the value m; an accumulator for accumulating the data kT from the period generator upon each occurrence of the pulse of the average period equal to the preset period; and a means for inhibiting, by a carry output of the accumulator, the counter from one counting of the reference clock pulse upon each occurrence of the pulse of the average period equal to the preset period when the carry is made, the output of the accumulator, except the carry output, being provided as the fractional period data.

13. A timing generating device according to claim 3 wherein the period generator comprises a counter for counting the reference clock pulses, the counter being initialized by each of the pulses of the average period equal to the preset period; a detecting means for creating the pulse of the average period equal to the preset period upon detecting that the counter has counted, from its initial state, the reference clock pulses by the number corresponding to the value m; and accumulator for accumulating the data kT from the period generator upon each occurrence of the pulse of the average period equal to the preset period; and a means for inhibiting, by a carry output of the accumulator, the counter from one counting of the reference clock pulse upon each occurrence of the pulse of the average period equal to the preset period when the carry is made, the output of the accumulator, except the carry output, being provided as the fractional period data.

14. A timing generating device according to claim 4 wherein the period generator comprises a counter for counting the reference clock pulses, the counter being initialized by each of the pulses of the average period equal to the preset period; a detecting means for creating the pulse of the average period equal to the preset period upon detecting that the counter has counted, from its initial state, the reference clock pulses by the number corresponding to the value m; an accumulator for accumulating the data kT from the period generator upon each occurrence of the pulse of the average period equal to the preset period; and a means for inhibiting, by a carry output of the accumulator, the counter from one counting of the reference clock pulse upon each occurrence of the pulse of the average period equal to the preset period when the carry is made, the output of the accumulator, except the carry output, being provided as the fractional period data.

15. A timing generating device according claim 5 wherein the period generator comprises a counter for counting the reference clock pulses, the counter being initialized by each of the pulses of the average period equal to the preset period; a detecting means for creating the pulse of the average period equal to the preset period upon detecting that the counter has counted, from its initial state, the reference clock pulses by the number corresponding to the value m; an accumulator for accumulating the data kT from the period generator upon each occurrence of the pulse of the average period equal to the preset period; and a means for inhibiting, by a carry output of the accumulator, the counter from one counting of the reference clock pulse upon each occurrence of the pulse of the average period equal to the preset period when the carry is made, the output of the accumulator, except the carry output, being provided as the fractional period data.

16. A timing generating device according to claim 12 wherein the coarse delay means comprises a counter which is initalized by each of the pulses of the average period equal to the preset period and counts the reference clock pulses, and a means for yielding the delayed pulse upon detecting that the counter has counted the reference clock pulses by the number n.

17. A timing generating device according to claim 13 wherein the coarse delay means comprises a counter which is initalized by each of the pulses of the average period equal to the preset period and counts the reference clock pulses, and a means for yielding the delayed pulse upon detecting that the counter has counted the reference clock pulses by the number n.

18. A timing generating device according to claim 14 wherein the coarse delay means comprises a counter which is initalized by each of the pulses of the average period equal to the preset period and counts the reference clock pulses, and a means for yielding the delayed pulse upon detecting that the counter has counted the reference clock pulses by the number n.

19. A timing generating device according to claim 15 wherein the coarse delay means comprises a counter which is initalized by each of the pulses of the average period equal to the preset period and counts the reference clock pulses, and a means for yielding the delayed pulse upon detecting that the counter has counted the reference clock pulses by the number n.

20. A timing generating device according to claim 16 wherein the coarse delay means is a coincidence detecting means for comparing the count value of the counter and the coarse delay data from the delay setting means and yielding the delayed pulse when they coincide with each other.

* * * * *

UNITED STATES PATENT AND TRADEMARK OFFICE
CERTIFICATE OF CORRECTION

PATENT NO. : 4,657,406

DATED : April 14, 1987

INVENTOR(S) : Yaeda

It is certified that error appears in the above-identified patent and that said Letters Patent is hereby corrected as shown below:

Front Page [57] ABSTRACT line 3, "intervals of an integral" should be --integral intervals--;

line 6, "and pulse" should be --and a pulse--;

line 11, "amount" should be --amount,--;

line 16, after "value," insert --thus--.

Col. 7, line 9, "Al" should be --$A_1$--;

line 56, "Al" should be --$A_1$--.

Col. 11, line 37, "coarse means" should be --coarse delay means--;

line 37, "the delay period" should be --the period--.

Col. 12, line 3 after "said" (third occurrence), insert --fine delay circuit correspondingly receiving as an input one of said--.

Signed and Sealed this

Twenty-second Day of September, 1987

Attest:

DONALD J. QUIGG

Attesting Officer     Commissioner of Patents and Trademarks